United States Patent [19]

Armstrong

[11] 4,343,451
[45] Aug. 10, 1982

[54] SENSOR RETAINING SYSTEM

[75] Inventor: John L. Armstrong, Detroit, Mich.

[73] Assignee: Burroughs Corporation, Detroit, Mich.

[21] Appl. No.: 100,500

[22] Filed: Dec. 5, 1979

[51] Int. Cl.³ .............................................. H05K 5/00
[52] U.S. Cl. ................................ 248/500; 174/52 R; 361/417
[58] Field of Search .............. 248/505, 500, 509, 510; 361/401, 417; 174/52 R; 339/17 LC, 75 R

[56] References Cited

U.S. PATENT DOCUMENTS

| | | | |
|---|---|---|---|
| 2,321,161 | 6/1943 | Sickles | 174/52 R X |
| 3,011,379 | 12/1961 | Corwin | 361/401 X |
| 3,849,838 | 11/1974 | Hehl | 361/417 X |
| 3,989,210 | 11/1976 | Berkman et al. | 248/500 X |
| 4,232,923 | 11/1980 | Otsuki et al. | 339/17 LC |

*Primary Examiner*—Peter P. Nerbun
*Attorney, Agent, or Firm*—Kenneth J. Cooper; Delbert P. Warner; Kevin R. Peterson

[57] ABSTRACT

A sensor retaining system includes a base having a recess in which the sensor is placed and a slideable, one-piece clip for pressing the sensor into the recess against the base. A slotted fulcrum restricts the lateral and forward movement of the clip through the slot and forms a backstop against which the clip may be deflected. Cams, adjacent to the sensor, deflect the clip to press the sensor against the base and stabilize the sensor in the recess of the base.

3 Claims, 3 Drawing Figures

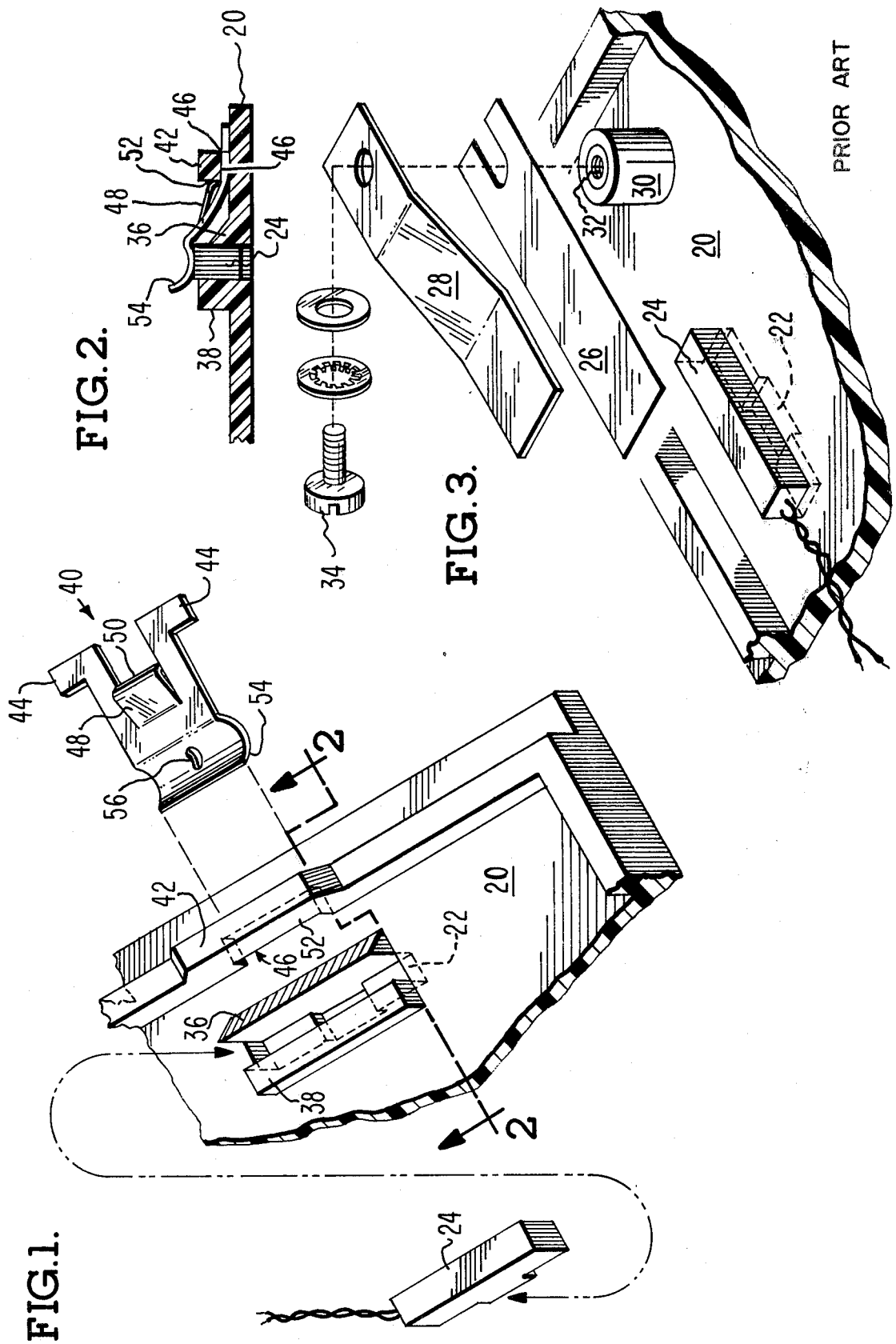

SENSOR RETAINING SYSTEM

BACKGROUND OF THE INVENTION

1. Field of the Invention

This invention relates to a sensor retaining system.

2. Description of the Prior Art

In the past, insertable sensors were held in position on a base by adhesives or tabs tightened by mechanical action to press the sensor against the base. However, disadvantages accompanied both retaining methods.

With adhesives, the sensor became a fixture on the base. Removal for testing, servicing, replacement, or repositioning was difficult and perhaps impossible without inflicting damage to the sensor and/or the supporting base.

Using tabs and mechanical tighteners presented installation space, time, materials, cost, and handling drawbacks. A combination of spring tabs would normally be required to press the sensor against the base. If the base material was a relatively soft plastic, a metal insert into a raised mounting plastic stud may be necessary to endure the torque of a tightened screw used to hold the spring tabs in place. In addition to the materials cost, the time involved in assembly and handling of the many parts, as well as the space needed to house them, had to be considered.

The applicant's invention minimizes the installation space, time, materials, costs, and handling drawbacks of the past mechanical sensor retaining devices by using a one piece clip in combination with an appropriately modified base in which the sensor is held. This removable retainer clip also permits sensor testing, servicing, replacement, or repositioning without damage to the sensor or its mounting base. Such features are likely to be unavailable when adhesives secure the sensor.

SUMMARY OF THE INVENTION

The sensor retaining system has a base with a recess in which the sensor is placed and a slideable, one piece clip, insertable by an individual using only his fingers, for pressing the sensor into the recess against the base. The base has an integrally molded, slotted fulcrum which restricts the lateral and forward movement of the clip through the slot. Also, the slotted fulcrum forms a backstop against which the inserted clip may be deflected.

The one piece clip is designed with flexure leaves having extensions, abuttable with the slotted fulcrum, to limit continued forward sliding of the clip. A locking portion of a retaining tang in the clip is abuttable with the fulcrum to inhibit untimely rearward travel of the clip once the forward sliding limit has been reached. However, to facilitate desired clip removal, the tang also includes a release portion, inclined toward the fulcrum's slot, for deflecting the locking portion into the slot when a sufficient rearwardly directed force is applied to the clip. To concentrate pressure on the sensor toward the base, the clip has a trough with a hole which may be used to assist the forward and rearward sliding of the clip.

To deflect the clip onto the sensor for applying the desired pressure, a cam ramp is integrally molded with the base and is adjacent to the sensor. A rear support cooperates with the cam ramp to straddle and thereby stabilize the sensor in the recess of the base.

BRIEF DESCRIPTION OF THE DRAWINGS

FIG. 1 illustrates the sensor retaining system prior to sensor and clip insertion;

FIG. 2 is a sectional view of FIG. 1, taken along line 2—2, with a sensor retained in the system; and FIG. 3 illustrates the prior system used to retain a sensor.

DETAILED DESCRIPTION

In the environment of a microfilm recorder, photosensors may be used to detect the passage of documents about to be photographed. Though the location of these sensors may be dependent upon when the sensing is to occur, the apparatus for maintaining those sensors in their positions is subject to cost, space, assembly, materials, and servicing considerations.

Referring to FIG. 3, the prior sensor retaining system included a base 20 molded with a recess 22 for containing a sensor 24. Since the base thickness was thin relative to the sensor, the recess 22 alone was not sufficiently deep to prevent teetering of sensor 24.

Sensor vibration and teetering were eliminated by combining metal tab 26 (FIG. 1), spring tab 28, mounting stud 30 integrally molded with the base 20, screw threaded metal insert 32 housed within the stud 30, and tightening screw 34. When assembled and tightened, pressure was exerted to immobilize the sensor 24 against the base 20. Though this combination produced effective results, the applicant perceived that materials, labor, and costs could be pared from the existing combination by a new, novel, and nonobvious invention which would perform the same function in a superior manner.

In FIGS. 1 and 2, a molded base 20 includes a recess 22 in which a sensor 24 is placed. However, unlike the prior design, the recess 22 is effectively made deeper by being straddled by a cam ramp 36 and rear support 38 which are integrally molded with the base. Consequently, when a sensor 24 is placed in recess 22 between cam ramp 36 and rear support 38, the teetering tendencies of the sensor, characteristic of the previous design before retaining pressure was applied, are eliminated.

To prevent vibration of sensor 24 and replace metal tab 26 (FIG. 3), spring tab 28, mounting stud 30, metal insert 32, and tightening screw 34, a one piece clip 40 (FIGS. 1 and 2) is slideable through slotted fulcrum 42, up cam ramp 36, and atop sensor 24. In the described embodiment, spring steel was chosen for clip 40 to furnish the desired pressure upon the sensor in reaction to the clip's upward bending from a stationary vertex in the slotted fulcrum 42.

When clip 40 is in the sensor retaining position, further forward sliding through slotted fulcrum 42 is prevented by two flexure leaves 44 having extensions which abut the sides of the fulcrum. Once the forward sliding limit of clip 40 is reached, the interior ceiling 46 (FIG. 1) of the slotted fulcrum no longer restricts the expansion of locking and release members 48 and 50 respectively. These members then expand from their compressed state to abut the exterior ceiling edge 52 of slotted fulcrum 42 and prevent untimely clip rearward movement. However, when extraction of clip 40 is required, the inclination of release member 50 into the slot of fulcrum 42 assists both the deflection of locking member 48 into the slot and the subsequent withdrawal of the clip when a sufficient rearward force is exerted on the clip.

Concentrating the pressure upon the sensor is the trough 54 of clip 40. Due to the curved design cooperating with the ramp 36, an individual can more comfortably pull and push the clip into a position using only his fingers. However, should extra effort be required, a hole 56 in the trough 54 allows the insertion of a tool to assist the placement of clip 40. In addition, the curved surface causes the entire spring force generated by the clip to bear on one line along the sensor to maximize the retaining pressure.

What is claimed is:

1. A sensor retaining system comprising:
   a base member having a recess for receiving the sensor;
   said base member having a fulcrum portion positioned adjacent the recess along a front portion of the base member, said fulcrum portion having a slot formed therethrough;
   said base member having a rear support wall and an intermediate support wall extending upward along the recess, said intermediate wall having an inclined ramp portion; and
   spring clip means for passing through the slot in the fulcrum portion and retaining the sensor within the recess;
   said spring clip means having an end formed into a curved follower for engaging the inclined ramp portion and traveling along the ramp and up onto the sensor thereby flexing said spring clip means.

2. The sensor retaining system of claim 1 wherein said spring clip means further includes a release member formed as a cantilever on said spring clip means;
   said release member flexing downward during passage of the spring clip means through the slot in said fulcrum portion and then snapping upward to engage the fulcrum and lock the spring clip means in place.

3. The sensor retaining system of claim 2 wherein said spring clip means includes a pair of flexure leaves for engaging the fulcrum portion adjacent said slot and preventing further inward movement of the spring clip means.

* * * * *